United States Patent
Ewanchuk et al.

(10) Patent No.: US 10,707,744 B2
(45) Date of Patent: Jul. 7, 2020

(54) DEVICE AND METHOD FOR CONTROLLING OPERATION OF POWER MODULE COMPOSED OF SWITCHES

(71) Applicant: MITSUBISHI ELECTRIC CORPORATION, Tokyo (JP)

(72) Inventors: Jeffrey Ewanchuk, Rennes (FR); Stefan Mollov, Rennes (FR)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 15/523,141

(22) PCT Filed: Nov. 12, 2015

(86) PCT No.: PCT/JP2015/005657
§ 371 (c)(1),
(2) Date: Apr. 28, 2017

(87) PCT Pub. No.: WO2016/084324
PCT Pub. Date: Jun. 2, 2016

(65) Prior Publication Data
US 2017/0324318 A1   Nov. 9, 2017

(30) Foreign Application Priority Data
Nov. 26, 2014   (EP) .................................. 14194940

(51) Int. Cl.
*H02M 1/32* (2007.01)
*H02M 1/08* (2006.01)
(Continued)

(52) U.S. Cl.
CPC .............. *H02M 1/32* (2013.01); *H01L 25/07* (2013.01); *H02M 1/08* (2013.01); *H03K 3/011* (2013.01);
(Continued)

(58) Field of Classification Search
CPC ............ H02M 1/00; H02M 1/08; H02M 1/32; H02M 2001/00; H02M 2001/0009;
(Continued)

(56) References Cited

U.S. PATENT DOCUMENTS 7,834,598 B1 * 11/2010 Wortham ................. H02M 1/32
323/224
2006/0221527 A1 * 10/2006 Jacobson ................. G01K 7/42
361/100

(Continued)

FOREIGN PATENT DOCUMENTS

CN    102859859 A    1/2013
JP    2000-116149 A   4/2000
(Continued)

OTHER PUBLICATIONS

Tian et al., "Study on case temperature distribution for condition monitoring of multidie IGBT modules", 2014 IEEE Applied Power Electronics Conference and Exposition—APEC 2014, IEEE, Mar. 16, 2014, pp. 2564-2568.
(Continued)

*Primary Examiner* — Lincoln D Donovan
*Assistant Examiner* — Dave Mattison
(74) *Attorney, Agent, or Firm* — Birch, Stewart, Kolasch & Birch, LLP

(57) ABSTRACT

The present invention concerns a device for controlling the operation of a power module composed of switches, each switch being composed of a plurality of power dies connected in parallel, characterized in that the device comprises, for each power die of the power module: —a temperature sensor to sense the temperature of the power die, —a current sensor to sense the current going through the power die, —a gate interrupt circuit to interrupt the signal provided to the power die if the sensed current is higher than a predeter-
(Continued)

mined current threshold, —a controller to reduce the conducting time of the die if the sensed temperature of the power die is higher than the average die temperature across the power dies of at least one switch.

15 Claims, 6 Drawing Sheets

(51) Int. Cl.
*H01L 25/07* (2006.01)
*H03K 17/082* (2006.01)
*H03K 17/12* (2006.01)
*H03K 17/14* (2006.01)
*H03K 3/011* (2006.01)
*H02M 1/00* (2006.01)

(52) U.S. Cl.
CPC ....... *H03K 17/0822* (2013.01); *H03K 17/122* (2013.01); *H03K 17/145* (2013.01); *H01L 2924/0002* (2013.01); *H02M 2001/0009* (2013.01); *H02M 2001/327* (2013.01)

(58) Field of Classification Search
CPC ...... H02M 2001/327; H03K 17/04126; H03K 17/063; H03K 17/0826; H03K 17/00; H03K 17/601; H03K 2217/00; H03K 2217/0036; H03K 3/00; H03K 3/011

USPC .......................................................... 327/109
See application file for complete search history.

(56) References Cited

U.S. PATENT DOCUMENTS

| | | | |
|---|---|---|---|
| 2011/0077794 A1* | 3/2011 | Ahuja | ...................... G01K 3/06 700/300 |
| 2011/0193542 A1 | 8/2011 | Kwok et al. | |
| 2012/0313595 A1* | 12/2012 | Mao | .................... H02M 3/1588 323/271 |
| 2013/0038140 A1 | 2/2013 | Seki et al. | |

FOREIGN PATENT DOCUMENTS

| | | |
|---|---|---|
| JP | 2009-148032 A | 7/2009 |
| WO | WO 2014/041922 A1 | 3/2014 |

OTHER PUBLICATIONS

Notification of Reasons for Refusal dated Nov. 13, 2018 in corresponding Japanese Application No. 2017-501423.
Office Action dated Apr. 2, 2019 in corresponding Chinese Application No. 201580063312.X.
Decision of Refusal dated Jun. 11, 2019 in corresponding Japanese Application No. 2017-501423.

* cited by examiner

[Fig. 1]
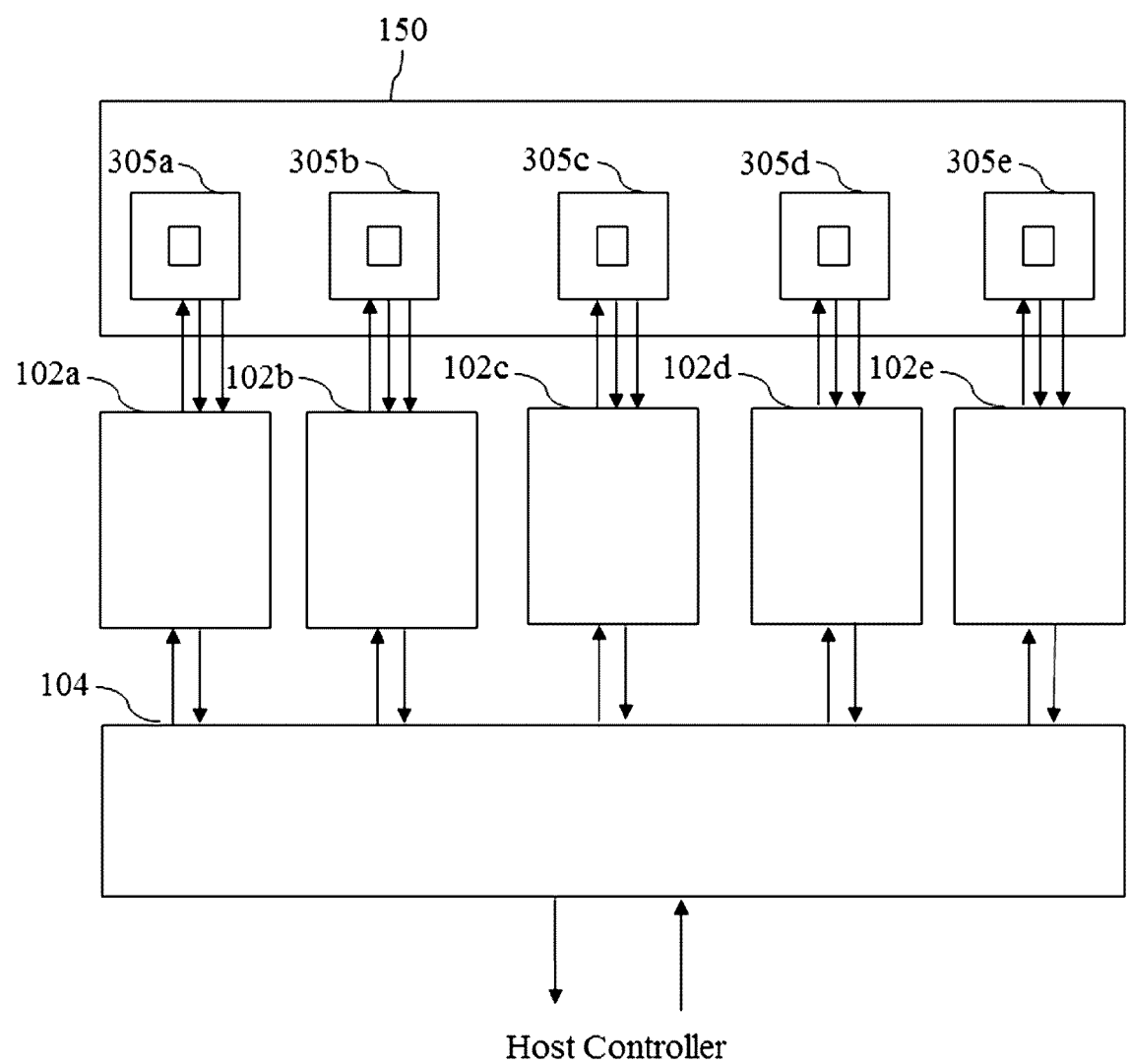

[Fig. 2]
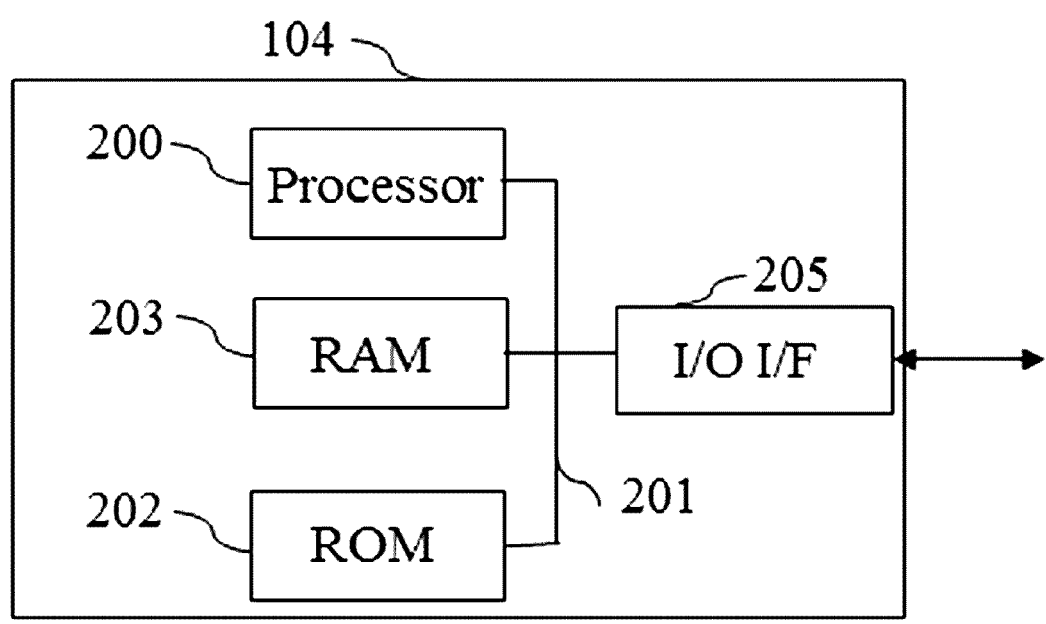

[Fig. 3]
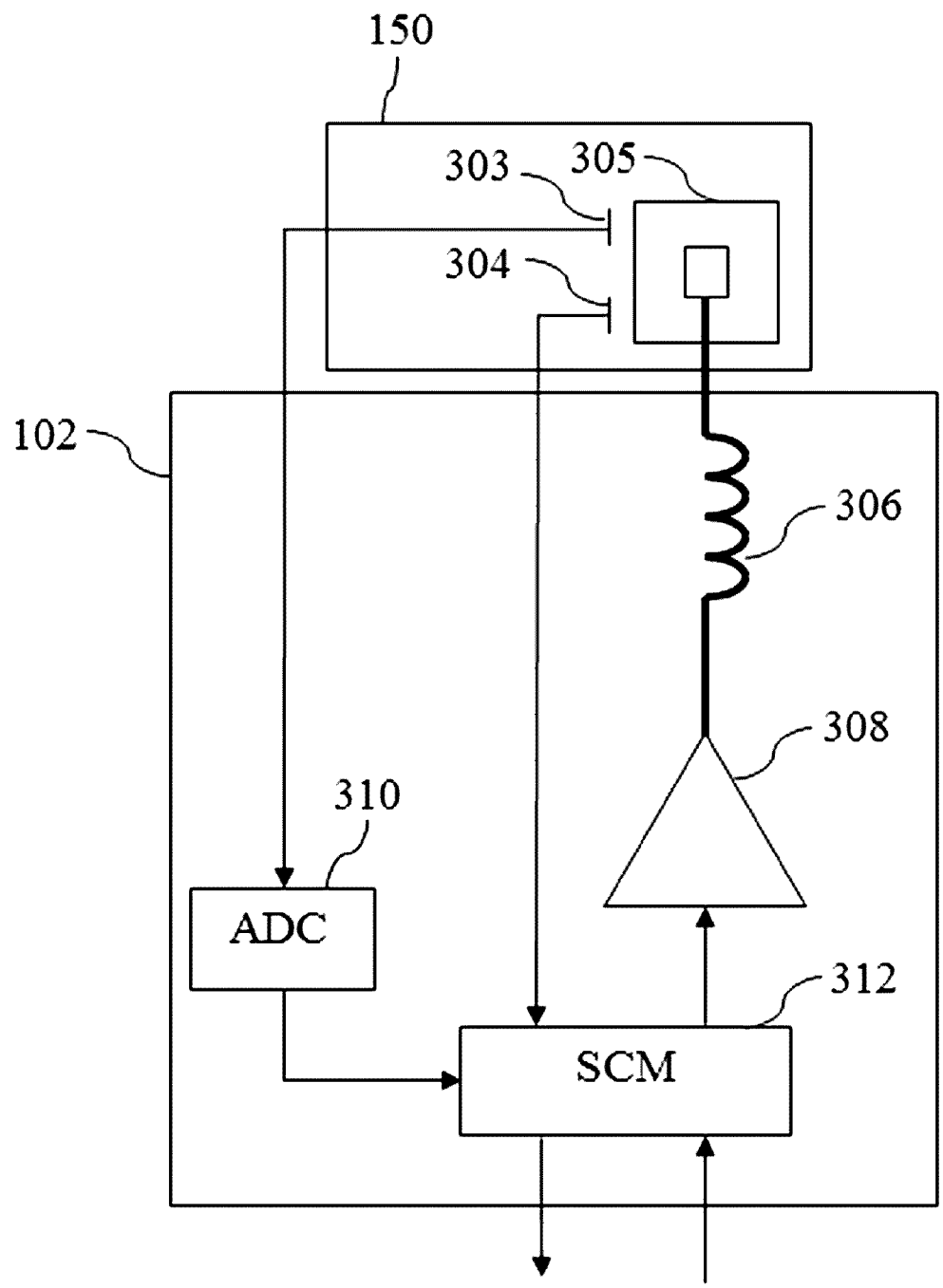

[Fig. 4]
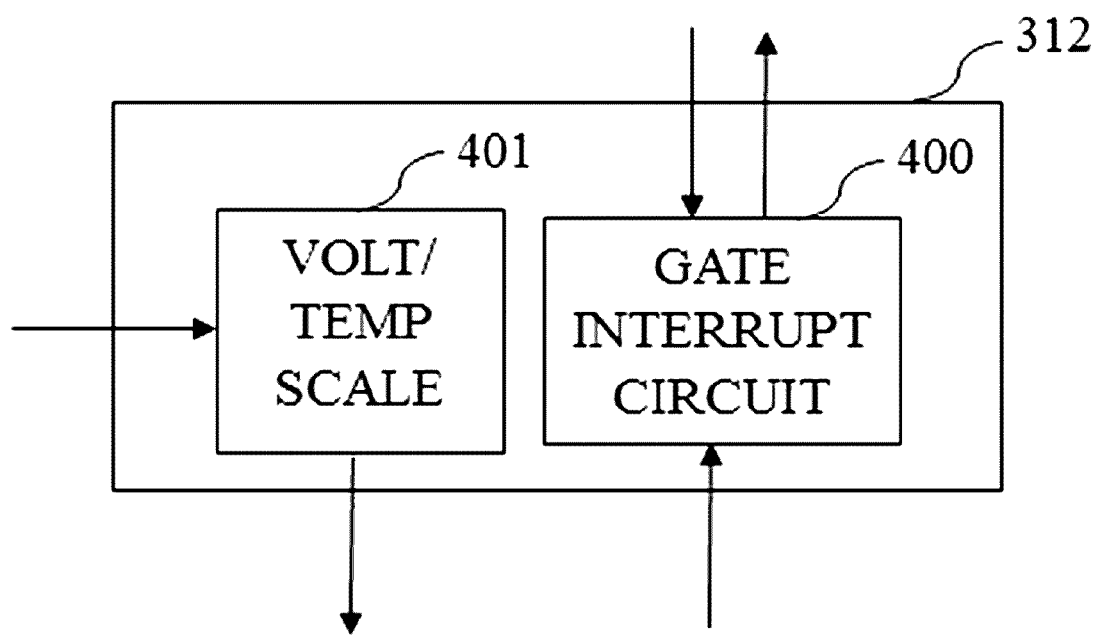
[Fig. 5]
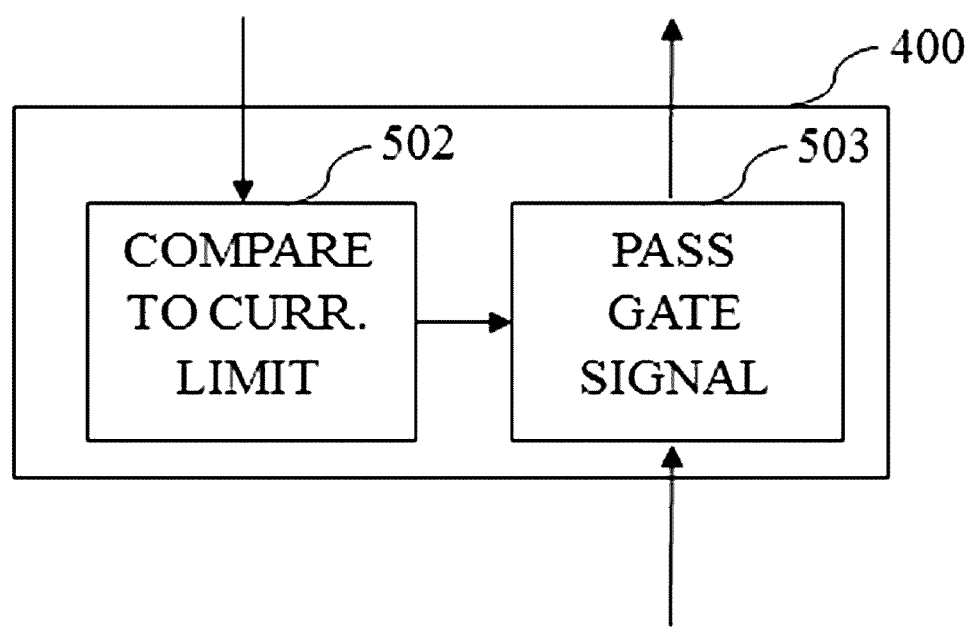

[Fig. 6]
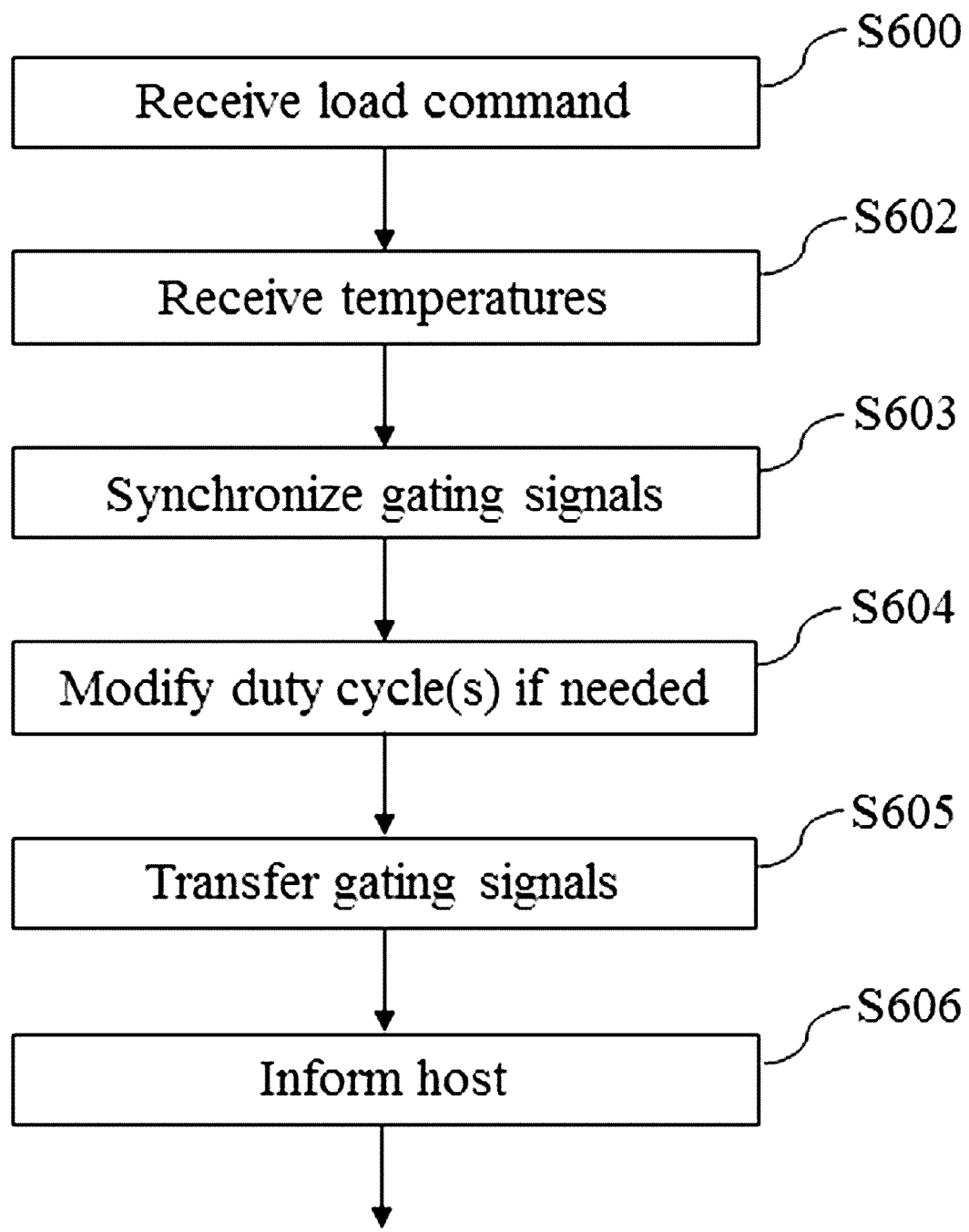

[Fig. 7]
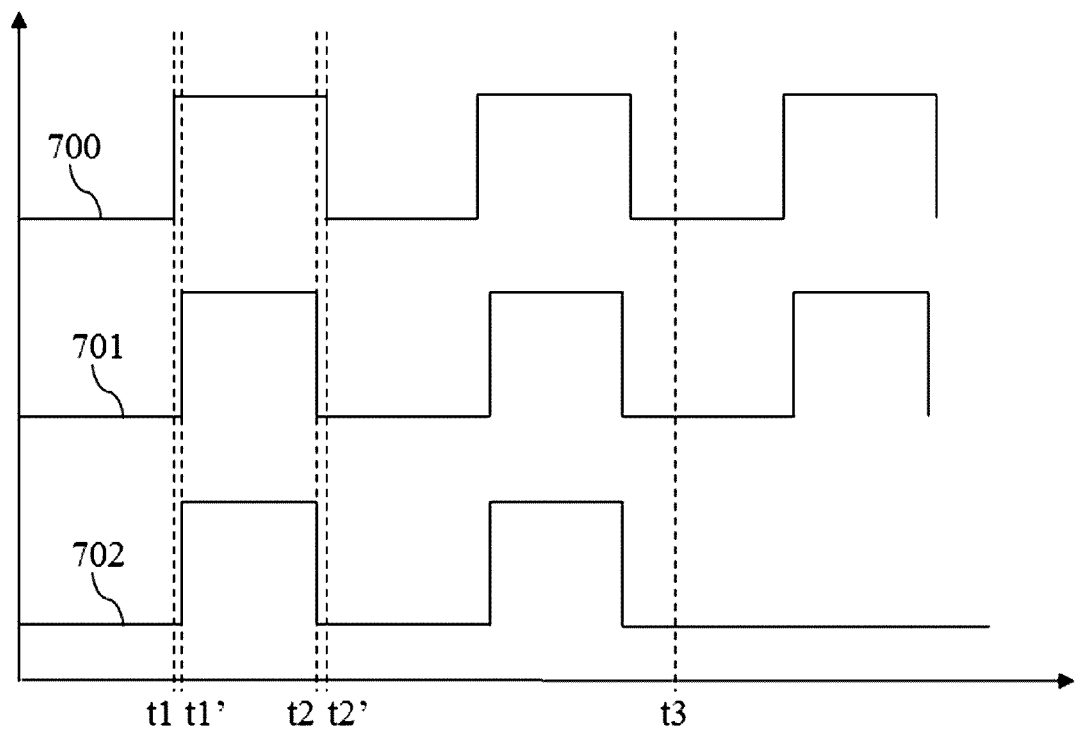

DEVICE AND METHOD FOR CONTROLLING OPERATION OF POWER MODULE COMPOSED OF SWITCHES

TECHNICAL FIELD

The present invention relates generally to a device for controlling the operation of a multi-die power module.

BACKGROUND ART

Multi-die power modules are classically composed of several parallel connected power dies and are used for increasing the current capability over that of a single power die.

For example, a three-phase converter is composed of four parallel power dies per switch, giving twenty four power dies in total.

Emerging devices technologies, such as SiC (Silicon Carbide) and GaN (Gallium Nitride) Transistors, are typically realized in high current density, small power dies due to limitations of yield and cost of wafer substrate.

In order to realize higher power SiC-based modules, a multitude of parallel connected SiC dies is necessary. Unlike parallel connected modules, parallel connected dies constitute a single switch that ideally commutates the same load current.

SUMMARY OF INVENTION

Technical Problem

However, regardless of the type of die used, i.e. diodes or voltage-driven switch, e.g. MOSFETs (Metal Oxide Semiconductor Field Effect Transistor), characteristics exist within the dies that limit the balanced sharing of the load current both statically and dynamically. The incremental addition of each parallel die does not result in full utilization of the die, and thus, more dies are needed in parallel to achieve a given current rating, thereby increasing the overall costs and physical surface area of the power module.

In addition to the electrical characteristics of the die, the physical placement of the dies within the power module also limits the reliability and utilization of the dies. One such example is the unequal thermal distribution within a module due to heating from neighbouring dies. Unless the design of the module allows for sufficient spacing between the dies, thereby increasing the physical size of the power module, the dies close to the center of the power module experience higher temperatures than the dies close to the periphery of the power module.

Another geometric consideration is the dynamic performance of the parallel dies. Due to the inevitably different routing of interconnections and the placement of the dies on the substrate, the parallel dies can begin to switch at different times, causing oscillatory behaviour that can impact the maximum capability of each die. This phenomenon is especially problematic for emerging wideband gap devices where the switching times are significantly shorter compared to silicon based devices.

Furthermore, localized temperature increases can occur across a set of dies due to localized degradation of the thermal interface of the die, e.g. as a result of over-stressing that set of dies.

Solution to Problem

The present invention aims at enhancing the switching speed of multi-die switches and to increase the maximum capability of a multi-die power module by minimising die de-rating due to thermal mismatches within the module.

To that end, the present invention concerns a device for controlling the operation of a power module composed of switches, each switch being composed of a plurality of power dies connected in parallel, characterized in that the device comprises, for each power die of the power module:
  a temperature sensor to sense the temperature of the power die,
  a controller to reduce the conducting time of the die if the sensed temperature of the power die is higher than the average die temperature across the power dies of at least one switch.

The present invention concerns also a method for controlling the operation of a power module composed of switches, each switch being composed of a plurality of power dies connected in parallel, characterized in that the method comprises the steps, executed for each power die of the power module of:
  sensing the temperature of the power die,
  reducing the conducting time of the die if the sensed temperature of the power die is higher than the average die temperature across the power dies of at least one switch.

Thus, the maximum capability of the multi-die power module is increased.

By controlling individually each die of the multi-die power module, it is possible to overcome problems related to different routing of interconnections and the placement of the dies, unequal thermal distribution within the multi-die power module and natural dispersion of the die parameters.

According to a particular feature, the device further comprises:
  a current sensor to sense the current going through the power die,
  a gate interrupt circuit to interrupt the signal provided to the power die if the sensed current is higher than a predetermined current threshold.

According to a particular feature, the conducting time of the power die is reduced by modifying the duty cycle of the signal provided to the power die.

Thus, the losses in the power die are reduced, lowering the local die temperature.

According to a particular feature, the signal is a gating signal.

Thus, the device acts to modulate the activity of the dies, transparent to the host controller.

According to a particular feature, the device further comprises an analogue to digital converter to convert the sensed temperature and a scaling device to scale the sensed temperature.

According to a particular feature, the signal provided to each power die is provided by a respective amplifier.

Thus, by providing an amplifier for each die, the gate-controller parasitic loop is reduced and allows for an increase of switching speed or a reduction of unwanted oscillations.

The characteristics of the invention will emerge more clearly from a reading of the following description of example embodiments, the said description being produced with reference to the accompanying drawings.

BRIEF DESCRIPTION OF DRAWINGS

FIG. 1 represents an example of a system for controlling the operation of a multi-die power module according to the present invention.

FIG. 2 represents an example of an architecture of a controller of the system for controlling the operation of a multi-die power module according to the present invention.

FIG. 3 represents an example of an architecture of a device for controlling the operation of a power die according to the present invention.

FIG. 4 represents an example of an architecture of a signal conditioning module of the device for controlling the operation of a power die according to the present invention.

FIG. 5 represents an example of an architecture of a gate interrupt circuit of the signal conditioning module.

FIG. 6 represents an algorithm executed by the controller of the system for controlling the operation of a multi-die power module.

FIG. 7 represents gate voltage variations generated by a device for controlling the operation of a power die according to the output of current and temperature sensing means.

DESCRIPTION OF EMBODIMENTS

FIG. 1 represents an example of a system for controlling the operation of a multi-die power module according to the present invention.

The system for controlling the operation of the multi-die power module 150 uses power die feedback mechanisms like thermal information or on-state voltages or individual die voltage/current trajectory, to modulate the control electrode command for each individual die in the multi-die power module 150.

The system for controlling the operation of the multi-die power module 150 obtains, for each die, thermal information or on-state voltages or die voltage/current trajectory and controls each die according to the obtained information.

The system for controlling the operation of the multi-die power module 150 comprises a plurality of devices 102 for controlling the operation of a power die 305, one for each die.

In the example of FIG. 1, the system for controlling the operation of the multi-die power module 150 comprises five devices 102a to 102e for controlling the operation of five power dies 305a to 305e, respectively.

Each device for controlling the operation of a power die 102 uses die information and controls said die in order to increase the performance of the multi-die power module 150, increasing then the utilization factor of each die. The architecture of a device for controlling the operation of a power die 102 is disclosed in FIG. 2.

Each device for controlling the operation of a power die 102 includes low cost circuitry to determine various state of health characteristics, e.g. gate threshold voltages or other measurable temperature-dependent parameters to determine the junction temperature and therefore be used to provide optimal control of the die. Each device for controlling the operation of a power die 102 uses information obtained from the die to translate the obtained information to useful state of health measurements, such as the junction temperature, in order to enable a controller 104 to balance the temperatures within the parallel set of dies. The controller 104 and each device for controlling the operation of a power die 102 modulates the die activity in response to light loads in order to improve operating efficiency.

Each device for controlling the operation of a power die 102 may also be removed from operation (passivation) in the event of a fault, thereby improving the fault tolerance of the entire power module 150.

In response to unequal interface degradation of the devices for controlling the operation of a power die 102, the loading of each die can be altered to reduce the thermal strain of the affected die and then improve the overall reliability of the power module 150.

It has to be noted here that each device for controlling the operation of a power die does not require an isolated power supply.

The controller is disclosed in more details in reference to FIG. 2.

FIG. 2 represents an example of an architecture of a controller of the system for controlling the operation of a multi-die power module according to the present invention.

The controller 104 has, for example, an architecture based on components connected together by a bus 201 and a processor 200 controlled by the program as disclosed in FIG. 6.

The bus 201 links the processor 200 to a read only memory ROM 202, a random access memory RAM 203 and an input/output interface I/O 205.

The memory 203 contains registers intended to receive variables and the instructions of the program related to the algorithm as disclosed in FIG. 6.

The processor 200 receives and transfers information to the devices for controlling the operation of the power dies 102 through the input/output interface I/O 205. The input output interface I/0 205 may be split into two interfaces, one with the host controller and one with the device for controlling the operation of a power die 102.

Through the input/output interface 205, the controller 104 receives an activation or load command from a host controller. The controller 104 interprets this activation command and provides synchronized control over the plurality of dies.

The controller 104 provides information, like for example the duty cycle, to each device for controlling the operation of a power die 102.

The read only memory 202 contains instructions of the programs related to the algorithm as disclosed in FIG. 6, which are transferred, when the controller 104 is powered on, to the random access memory 203.

Any and all steps of the algorithm described hereafter with regard to FIG. 6 may be implemented in software by execution of a set of instructions or program by a programmable computing machine, such as a PC (Personal Computer), a DSP (Digital Signal Processor) or a microcontroller; or else implemented in hardware by a machine or a dedicated component, such as an FPGA (Field-Programmable Gate Array) or an ASIC (Application-Specific Integrated Circuit).

In other words, the controller 104 includes circuitry, or a device including circuitry, causing the controller 104 to perform the steps of the algorithm described hereafter with regard to FIG. 6.

The controller 104 may be realized, for example, by a pre-programmed CPLD (Complex Programmable Logic Device).

According to the invention, from the synchronized control pattern and from the sensed temperature value, the controller 104 generates a duty cycle which is different from the one corresponding to the synchronized control pattern if the sensed temperature is higher than a predetermined temperature threshold.

For example, if the parasitic inductor 306 generates oscillatory behavior that impacts the temperature of the die 305, the temperature sensed by the temperature sensing means 303, converted by the ADC 310 and scaled by the voltage and/or temperature scaling device 401 is higher than the predetermined temperature threshold, the controller 104 reduces the duty cycle of the periodic signal which drives the power die in order to reduce the conduction time of the power die 305.

FIG. 3 represents an example of an architecture of a device for controlling the operation of a power die according to the present invention.

Each device for controlling the operation of a power die 102 comprises temperature sensing means 303 for sensing the junction temperature of the power die 305 and/or current sensing means 304 for sensing the current going through the power die 305.

The temperature sensing means 303 may be a thermocouple or may be implemented by monitoring threshold voltages or other measurable temperature-dependent parameters to determine the junction temperature.

The current sensing means 304 may be part of a die function, for example as a scaled current mirror of the drain current, or separately from a sensor, for example as a current transducer, or an estimator using known on-state voltage dependence on current.

The current sensing means 304 is connected to a signal conditioning module 312. The current amplifier 308 and the signal conditioning module 312 interrupt the voltage control to the power die 305 when the current is higher than a predetermined current threshold, for example during a short circuit event. When the current is lower than the predetermined current threshold, the current amplifier 308 and the signal conditioning module 312 amplify the current to be provided to the power die 305 according to voltage control signals provided by the controller 104.

The inductor 306 represents the parasitic inductance of the routing of interconnections between the power die 305 and the current amplifier 308, or any coupling inter-die parasitics.

The temperature sensing means 303 is connected to an analogue to digital converter 310 which provides the digital signal to the signal conditioning module 312.

The signal conditioning module 312 is disclosed in more details in reference to FIG. 4.

FIG. 4 represents an example of an architecture of a signal conditioning module of the device for controlling the operation of a power die according to the present invention.

The signal conditioning module 312 comprises a voltage and/or temperature scaling device 401 and a gate interrupt circuit 400. The voltage and/or temperature scaling device 401 translates the feedback signal of the temperature sensing means 303 converted by the ADC to a scaled value for the controller 104.

FIG. 5 represents an example of an architecture of a gate interrupt circuit of the signal conditioning module.

The gate interrupt module 400 interrupts the voltage control signals provided by the controller 104 to the current amplifier 308 in the event of an over-current event sensed from the current sensing means 304.

The current amplifier 308 receives, from the controller 104, synchronized control pattern like the duty cycle of a periodic signal once passed the gate interrupt circuit 400 of the signal conditioning module 312.

The gate interrupt circuit 400 is composed of a means to compare 502 the sensed current from the current sensing means 304 to a limit value, which modulates the pass gate signal circuit of 503. As an example, the means to compare 502 can be implemented by means of a comparator which modulates a switch of a pass gate signal 503, allowing the gating signal either to be blocked or removing that power device from operation.

FIG. 6 represents an algorithm executed by the controller of the system for controlling the operation of a multi-die power module.

At step S600, the controller 104 receives from the host through the input/output interface 205, an activation command. The activation command may be a duty cycle or a current to be provided by the multi-die power module 150.

At step S602, the controller 104 obtains for each die, information representative of the temperature of the die from each module 150. At that step, the controller 104 calculates an average of the temperatures.

At step S603, the controller 104 determines duty cycles corresponding to the load command and synchronizes the gating signal of each operating die.

At step S604, the controller 104, for each die, compares the temperature of the die to the average value determined at step 602. If the temperature of the die is greater than the average value, the controller 104 reduces the duty cycle for the die.

At step S605, the controller transfers to each device for controlling the operation of a power die 102, information representative of the duty cycle.

At step S606, the controller 104 may also inform the host controller parameter information for condition monitoring purposes or the state of health of each device.

FIG. 7 represents currents variations generated by a device for controlling the operation of a power die according to the output of current and temperature sensing means.

The curve noted 700 corresponds to a periodic voltage to be transmitted to the power die 305 which is provided by the current amplifier 308 with a duty cycle that corresponds to the synchronized control pattern provided by the controller 104. Instants t1 and t2' correspond to the switching of the current.

The curve noted 701 corresponds to a periodic voltage control signal provided by the current amplifier 308 with a duty cycle that is reduced by the controller 104. The curve 701 corresponds to an operating mode wherein the sensed temperature is higher than a target temperature, determined for the purpose of temperature equilibrium between dies. Instants t1' and t2 correspond to the switching of the current according to the modified duty cycle.

The curve noted 702, up to instant t3, corresponds to a periodic voltage control signal provided by the current amplifier 308 with a duty cycle that is reduced by the controller 104, similarly to curve 701. The curve noted 702, after instant t3, corresponds to an operating mode wherein the current amplifier 308 and signal conditioning module 312 interrupt the providing of current to the power die 305 when the current is higher than a predetermined current or a temperature threshold.

Naturally, many modifications can be made to the embodiments of the invention described above without departing from the scope of the present invention.

INDUSTRIAL APPLICABILITY

The device and method of the present invention are applicable to control for operation of multi-die power modules in many kinds of fields.

The invention claimed is:

1. A device for controlling the operation of a multi-die power module composed of a plurality of power dies connected in parallel, comprising:
    a plurality of controllers, one for each of the plurality of power dies, configured to control operation of a respective one of the plurality of power dies;

wherein each of the plurality of controllers includes a temperature sensor to sense the temperature of the respective power die; and a host controller configured to obtain information representative of a temperature of each of the plurality of power dies and calculate an average temperature of the plurality of power dies;

compare, for each of the plurality of power dies, the respective temperature of an individual power die to the average temperature; and reduce the conducting time of a respective power die if the temperature of the respective power die is higher than the average temperature across the plurality of power dies.

2. The device according to claim 1, wherein each of the plurality of controllers further includes:

a current sensor to sense the current going through the respective power die, and a gate interrupt circuit to interrupt the signal provided to the respective power die if the sensed current is higher than a predetermined current threshold.

3. The device according to claim 1, wherein host controller reduces the conducting time of the respective power die by modifying the duty cycle of the signal provided to the power die.

4. The device according to claim 2, wherein the host controller reduces the conducting time of the respective power die by modifying the duty cycle of the signal provided to the power die.

5. The device according to claim 3, wherein the signal is a gating signal.

6. The device according to claim 4, wherein the signal is a gating signal.

7. The device according to claim 1, wherein each of the plurality of controllers further includes an analogue to digital converter to convert the sensed temperature and a scaling device to scale the sensed temperature.

8. The device according to claim 2, each of the plurality of controllers further includes an analogue to digital converter to convert the sensed temperature and a scaling device to scale the sensed temperature.

9. The device according to claim 3, wherein the signal provided to each power die is provided by a respective amplifier.

10. The device according to claim 4, wherein the signal provided to each power die is provided by a respective amplifier.

11. The device according to claim 7, wherein the signal provided to each power die is provided by a respective amplifier.

12. The device according to claim 8, wherein the signal provided to each power die is provided by a respective amplifier.

13. The device according to claim 1, wherein the controller modifies a duty cycle provided by a host controller.

14. The device according to claim 2, wherein the controller modifies a duty cycle provided by a host controller.

15. A method for controlling the operation of a multi-die power module composed of a plurality of power dies connected in parallel, the method comprising:

sensing by each of a plurality of controllers configured to control operation of a respective one of the plurality of power dies, the temperature of a respective one of the plurality of power dies, obtaining, by a host controller, information representative of the sensed temperature of each of the plurality of power dies and calculating an average temperature of the plurality of power dies;

compareing, for each of the plurality of power dies, the respective sensed temperature of an individual power die to the average temperature; and reducing the conducting time of a respective power die if the sensed temperature of the respective power die is higher than the average temperature across the plurality of power dies.

\* \* \* \* \*